United States Patent
Qian et al.

(10) Patent No.: US 9,402,303 B2
(45) Date of Patent: Jul. 26, 2016

(54) FLEXIBLE PRINTED CIRCUIT CABLES WITH SLITS

(71) Applicant: Apple Inc., Cupertino, CA (US)

(72) Inventors: Amy Qian, San Jose, CA (US); Carl R. Peterson, Santa Clara, CA (US); Jeremy C. Franklin, San Francisco, CA (US); Joseph F. Alverson, San Francisco, CA (US); Kevin D. Gibbs, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 229 days.

(21) Appl. No.: 13/908,280

(22) Filed: Jun. 3, 2013

(65) Prior Publication Data

US 2014/0354900 A1   Dec. 4, 2014

(51) Int. Cl.
| | |
|---|---|
| H05K 1/11 | (2006.01) |
| H05K 3/46 | (2006.01) |
| H05K 1/02 | (2006.01) |
| G06F 1/16 | (2006.01) |
| H05K 1/14 | (2006.01) |

(52) U.S. Cl.
CPC ............ *H05K 1/0221* (2013.01); *G06F 1/1658* (2013.01); *H05K 1/028* (2013.01); *H05K 1/147* (2013.01); *H05K 2201/042* (2013.01); *H05K 2201/0715* (2013.01); *H05K 2201/09063* (2013.01); *H05K 2201/09145* (2013.01); *H05K 2201/09236* (2013.01); *H05K 2201/09618* (2013.01); *H05K 2201/10128* (2013.01)

(58) Field of Classification Search
CPC ..... H05K 1/118; H05K 1/028; H05K 1/0393; H05K 3/4635
See application file for complete search history.

(56) References Cited

U.S. PATENT DOCUMENTS

| | | | | |
|---|---|---|---|---|
| 3,267,402 | A * | 8/1966 | Reimer | H01F 41/041 174/117 R |
| 3,818,122 | A * | 6/1974 | Luetzow | H01B 7/04 174/117 FF |
| 4,716,259 | A * | 12/1987 | Tokura | H05K 1/028 174/254 |
| 5,173,842 | A * | 12/1992 | Depew | H01L 23/4006 257/E23.084 |
| 5,204,806 | A * | 4/1993 | Sasaki | H05K 1/189 361/749 |

(Continued)

FOREIGN PATENT DOCUMENTS

| | | |
|---|---|---|
| GB | 2437665 | 10/2007 |
| JP | 2001267696 A * | 9/2001 |
| WO | 2012061440 | 5/2012 |

*Primary Examiner* — Jeremy C Norris
*Assistant Examiner* — Nathan Milakovich
(74) *Attorney, Agent, or Firm* — Treyz Law Group, P.C.; G. Victor Treyz; Joseph F. Guihan

(57) ABSTRACT

An electronic device contains electrical circuits. The circuits may include circuitry on printed circuit boards and components such as a touch screen display and buttons. Signal paths for routing signals between the electrical circuits may be formed from metal traces on flexible printed circuit cables. The flexible printed circuit cables may be bent around one or more bend axes. A flexible printed circuit cable may be formed from a flexible polymer substrate having one or more layers of polymer. Upper and lower ground layers may be supported by the flexible polymer substrate. The metal traces for the signal paths may lie between the upper and lower ground layers. Longitudinal slits within the flexible printed circuit may be formed that pass through the ground layers and the polymer layers. Vias may be formed that couple the ground layers together. The vias may run along the edges of the slits.

20 Claims, 11 Drawing Sheets

(56) References Cited

U.S. PATENT DOCUMENTS

| | | | | |
|---|---|---|---|---|
| 5,262,590 | A * | 11/1993 | Lia | 174/36 |
| 5,322,974 | A * | 6/1994 | Walston | H05K 3/4685 174/250 |
| 5,449,862 | A * | 9/1995 | Spencer | H01R 12/62 174/117 F |
| 5,903,440 | A * | 5/1999 | Blazier | H05K 1/0278 174/254 |
| 6,104,464 | A * | 8/2000 | Adachi | G02F 1/13452 257/E23.177 |
| 6,959,210 | B2 * | 10/2005 | Nakamura | H01Q 1/084 336/200 |
| 6,995,814 | B2 | 2/2006 | Kanatsu | |
| 7,057,563 | B2 * | 6/2006 | Cox | H01Q 1/085 343/700 MS |
| 7,342,178 | B2 * | 3/2008 | Yang | H05K 1/028 174/254 |
| 7,373,184 | B2 * | 5/2008 | Kurono | H01R 35/02 455/575.1 |
| 8,022,308 | B2 * | 9/2011 | Hu et al. | 174/254 |
| 8,058,560 | B2 * | 11/2011 | Lo | H05K 1/028 174/117 F |
| 8,102,659 | B2 * | 1/2012 | Yeon | G02F 1/13452 349/150 |
| 8,408,928 | B2 | 4/2013 | Won et al. | |
| 8,587,953 | B2 * | 11/2013 | Brock et al. | 361/755 |
| 8,592,687 | B2 * | 11/2013 | Kato et al. | 174/254 |
| 8,690,412 | B2 * | 4/2014 | Franklin | G02B 6/0073 362/612 |
| 8,998,454 | B2 * | 4/2015 | Wang et al. | 362/294 |
| 9,078,352 | B2 * | 7/2015 | Laturell | H01L 23/4985 |
| 2009/0173533 | A1 * | 7/2009 | Brock | H01R 12/592 174/350 |
| 2010/0148654 | A1 * | 6/2010 | Yan | H05K 3/0014 313/243 |
| 2013/0050945 | A1 | 2/2013 | Diep et al. | |
| 2013/0127560 | A1 * | 5/2013 | Kato et al. | 333/12 |
| 2013/0249740 | A1 * | 9/2013 | Shedletsky | 343/700 MS |
| 2014/0014409 | A1 * | 1/2014 | Lin et al. | 174/75 R |
| 2014/0240985 | A1 * | 8/2014 | Kim | H05K 1/028 362/249.04 |
| 2014/0292449 | A1 * | 10/2014 | Kato et al. | 333/238 |
| 2014/0301047 | A1 * | 10/2014 | Kato | 361/749 |
| 2014/0374147 | A1 * | 12/2014 | Lin et al. | 174/254 |
| 2015/0008017 | A1 * | 1/2015 | Na | H05K 1/028 174/254 |

* cited by examiner

FLEXIBLE PRINTED CIRCUIT CABLES WITH SLITS

BACKGROUND

This relates generally to electronic devices and, more particularly, to electronic devices with flexible printed circuit cables.

Electronic devices include electrical components. Signals are often routed between electrical components using cables formed from flexible printed circuits. Flexible printed circuit cables are compact and lightweight and can be bent to accommodate tight spaces within an electronic device housing.

As signal routing needs for electronic devices become increasingly complex, there is a desire to create flexible printed circuit cables with more signal lines. At the same time, printed circuit board real estate concerns encourage the use of shorter cables.

To accommodate concerns about increasing routing complexity while maintaining a compact size for a flexible printed circuit cable, designers may create shorter and wider flexible printed circuit cables. Use of this type of cable poses challenges. If care is not taken, cables may become stiff and resistant to flexing. As a result, manufacturing variations in the locations of the components being coupled using a flexible printed circuit cable can give rise to excessive stresses in the flexible printed circuit cable. These stresses may cause connectors to pull apart or can lead to other potential failures.

It would therefore be desirable to be able to provide electronic devices with improved flexible printed circuit cables.

SUMMARY

An electronic device contains electrical circuits. The circuits may include circuitry on printed circuit boards and components such as a touch screen display and buttons. The touch screen display may have a display formed from an array of display pixels and a two-dimensional capacitive touch sensor array that forms a touch sensor overlapping the array of display pixels.

Signals paths for routing signals between the electrical circuits may be formed from metal traces on flexible printed circuit cables. The flexible printed circuit cables may be bent around one or more bend axes. A flexible printed circuit cable may have one end that is coupled to a printed circuit board and another end that branches into first and second branches. The first branch may be coupled to a touch sensor in the display. The second branch may be coupled to an array of display pixels in the display.

A flexible printed circuit cable may be formed from a flexible polymer substrate having one or more layers of polymer. Upper and lower ground layers may be supported by the flexible polymer substrate. The metal traces for the signal paths may lie between the upper and lower ground layers. Longitudinal slits within the flexible printed circuit may be formed that pass through the ground layers and the polymer layers. Vias may be formed that couple the ground layers together. The vias may run along the edges of the slits.

Further features, their nature and various advantages will be more apparent from the accompanying drawings and the following detailed description of the preferred embodiments.

DETAILED DESCRIPTION

Flexible printed circuits are formed from layers of flexible polymer or other dielectric and patterned metal traces. Substrates that may be used in forming flexible printed circuits include layers of polyimide and sheets of other flexible polymer materials. Metal traces on flexible printed circuits may be formed from metals such as copper or other traces that can be patterned into signal lines and ground plane structures. Metal flexible printed circuit traces may be patterned using blanket physical vapor deposition followed by photolithographic patterning, by depositing metal lines using ink-jet printing or screen printing techniques, using laser-based processing (e.g., using laser light to selectively activate substrate regions followed by electroplating to grow metal on the activated regions), or by using other suitable patterning techniques.

The metal traces on flexible printed circuits can be used to form serial and parallel digital data signal paths and analog signal paths. Flexible printed circuits that contain signal lines for conveying analog and/or digital signals are sometimes referred to as flexible printed circuit buses or flexible printed circuit cables. As an example, a flexible printed circuit may contain a signal bus containing tens or hundreds of parallel signal lines. A flexible printed circuit of this type may be used as a cable to route signals between electrical components on a printed circuit board and components such as display or touch sensor components. Flexible printed circuit cables may also be used to route signals between printed circuits, between a printed circuit and components such as buttons and other input-output devices, between a camera and other circuitry in an electronic device, or between other circuits.

Figure 1:
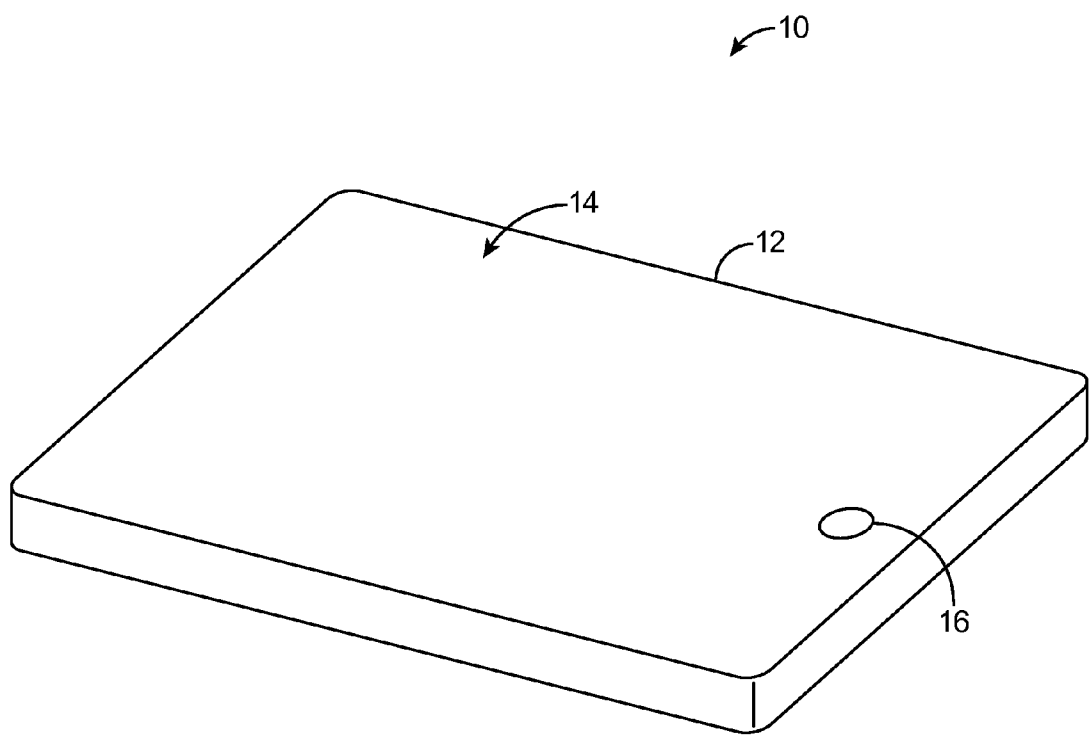
FIG. 1 is a perspective view of an illustrative electronic device of the type that may be provided with flexible printed circuit cabling having slits running along the length of the flexible printed circuit cabling in accordance with an embodiment.

An illustrative electronic device that may include flexible printed circuit cabling is shown in FIG. 1. Electronic devices such as device 10 of FIG. 1 may be cellular telephones, media players, other handheld portable devices, somewhat smaller portable devices such as wrist-watch devices, pendant devices, or other wearable or miniature devices, gaming equipment, tablet computers, notebook computers, desktop computers, televisions, computer monitors, computers integrated into computer displays, or other electronic equipment.

In the example of FIG. 1, device 10 includes a display such as display 14. Display 14 has been mounted in a housing such as housing 12. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.).

Display 14 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Capacitive touch screen electrodes may be formed from an array of indium tin oxide pads or other transparent conductive structures. A capacitive touch sensor may be formed from an array of capacitive electrodes that are formed on a layer of glass or plastic or other substrate material. The substrate may be a clear material to allow the touch sensor to overlap a display such as display 14. The capacitive touch sensor in a touch screen display may be formed form a substrate that is attached to display layers with adhesive or may be formed as part of a display arrangement with integrated touch sensor and display structures (as examples).

Display 14 may include an array of display pixels formed from liquid crystal display (LCD) components, an array of electrophoretic display pixels, an array of plasma display pixels, an array of organic light-emitting diode display pixels, an array of electrowetting display pixels, or display pixels based on other display technologies.

Display 14 may be protected using a display cover layer such as a layer of transparent glass or clear plastic. Openings may be formed in the display cover layer. For example, an opening may be formed in the display cover layer to accommodate a button such as button 16. An opening may also be formed in the display cover layer to accommodate ports such as a speaker port or other components.

In the center of display 14, display 14 may contain an array of active display pixels. This region is sometimes referred to as the active area of the display. A rectangular ring-shaped region surrounding the periphery of the active display region may not contain any active display pixels and may therefore sometimes be referred to as the inactive area of the display. The display cover layer or other layers in display 14 may be provided with an opaque masking layer in the inactive region to hide internal components from view by a user. Windows in inactive edge portions of display 14, housing 12, and other portions of device 10 may be used to accommodate components such as a proximity sensor, ambient light sensor, microphone, camera, and antennas.

Figure 2:
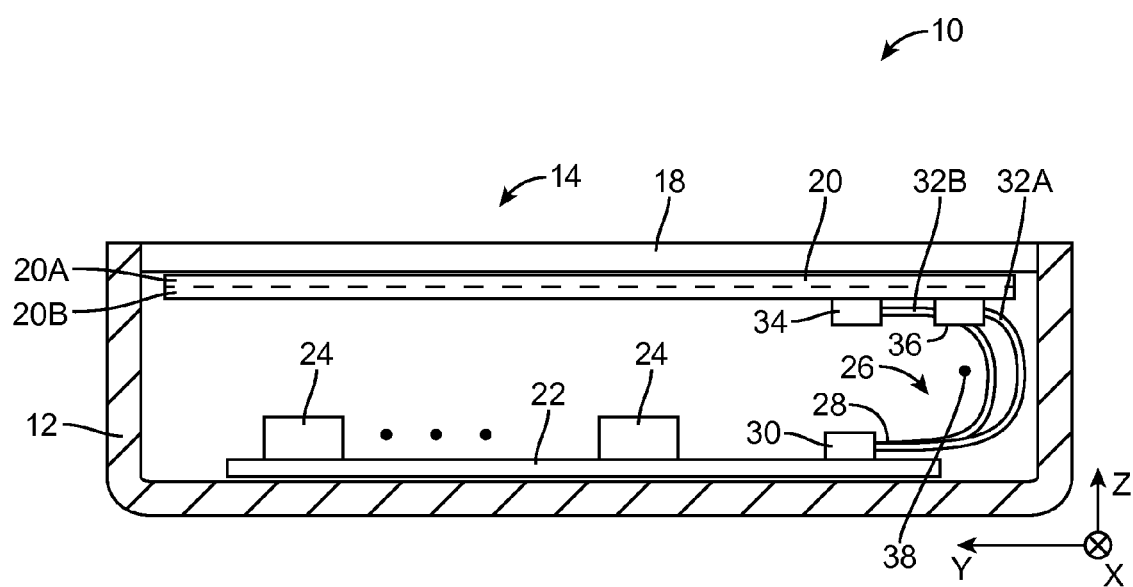
FIG. 2 is a cross-sectional side view of an electronic device with a flexible printed circuit cable of the type that may be provided with slits in accordance with an embodiment.

A cross-sectional side view of device 10 is shown in FIG. 2. As shown in the illustrative configuration of FIG. 2, device 10 may have a display such as display 14 that is mounted on the front face of device 10 in housing 12. Display 14 may have a display cover layer 18 and a display module such as display module 20. Display cover layer 18 may be formed from a clear glass layer, a layer of transparent plastic, or other cover layer material. A layer of ink (e.g., black ink or white ink or ink of other colors) may form a rectangular ring-shaped opaque masking layer in an inactive border region of display 14.

Display module 20 may be, for example, a liquid crystal display module or an organic light-emitting diode display layer (as examples). Display module 20 may include an array of display pixels in one or more display layers (shown as display layers 20A—also sometimes referred to as display pixel array 20A or display 20A) and a two-dimensional touch sensor such as a capacitive touch sensor or a touch sensor formed using other touch technologies (shown as touch sensor layer 20B). The structures of display layers 20A and touch sensor layers 20B may be laminated to each other using adhesive or may be formed as integral portions of a common touch screen display assembly.

Device 10 may include components such as components 24 that are mounted on one or more substrates such as substrate 22. Substrate 22 may be a dielectric carrier such as a molded plastic carrier or may be a printed circuit. For example, substrates 48 may be a printed circuit such as a rigid printed circuit board formed from a dielectric material such as fiberglass-filled epoxy or may be a flexible printed circuit formed from a dielectric layer such as a sheet of polyimide or other flexible polymer layer. Metal interconnect paths may be provided on within substrate 22 to allow substrate 22 to covey signals between components mounted on substrate 22. With one illustrative configuration, which may sometimes be described herein as an example, substrate 22 is a rigid printed circuit substrate.

Electrical components such as components 24 may be mounted on printed circuit 22 and may be electrically connected to conductive paths in printed circuit 22. Components 24 may be, for example, integrated circuits, discrete components such as capacitors, resistors, and inductors, switches, connectors, sensors, input-output devices such as status indicators lights, audio components, or other electrical and/or mechanical components for device 10. Components 24 may be attached to printed circuit 22 using solder, welds, anisotropic conductive film or other conductive adhesives, or other conductive connections.

Flexible printed circuit cables such as flexible printed circuit cable 26 may be used to route signals within device 10. For example, a flexible printed circuit cable may be used to couple two different printed circuits together, may be used to couple a printed circuit to a component, may be used to interconnect components, or may otherwise be used in providing routing paths between circuits in device 10.

Flexible printed circuit cable 26 and other printed circuits in device 10 such as printed circuit board 22 may contain signal paths. The printed circuit signal paths may sometimes be referred to as lines, traces, or interconnects and may be formed from conductive materials such as metal (e.g., copper, gold, aluminum, etc.). Using these printed circuit paths, components 22 may be interconnected with each other and may be interconnected with other components in device 10 such as touch sensor 20B and display 20A in touch screen display 14.

The metal traces in flexible printed circuit cable 26 may be coupled to display 14 and substrates such as substrate 22 or other circuits in device 10 using anisotropic conductive film or other conductive adhesive, using solder, or using other coupling mechanisms. As shown in FIG. 2, for example, flexible printed circuit 26 may have an end such as end 28 that is coupled to traces in printed circuit 22 using connector 30. Connector 30 may be a printed circuit connector such as a board-to-board connector or a zero-insertion-force connector (as examples). Flexible printed circuit 26 may have a Y-shape with two branches that extend away from end 28 to form ends 32A and 32B. The metal traces in flexible printed circuit 26 at ends 32A and 32B may be coupled to circuits such as circuits in display 14 or other components or printed circuits. As an example, end 32A of flexible printed circuit 26 may be coupled to display (display pixel array) 20A using connector structures 36 and end 32B of flexible printed circuit 26 may be coupled to touch sensor 20B using connector structures 34. Connector structures 34 and 36 may include anisotropic conductive film connections, zero-insertion-force connectors, board-to-board connector structures, printed circuits, welds, solder connections, or other coupling structures and circuitry. As an example, structures 36 may include a printed circuit board and circuitry that is coupled to display 20A using anisotropic conductive film and structures 34 may include a connector that is coupled to touch sensor 20B.

As shown in FIG. 2, flexible printed circuit cable 26 may be bent around bend axis 38. Bend axis 38 may extend into the page in the orientation of FIG. 2 (i.e., parallel to the X axis). To ensure that flexible printed circuit cable 26 is sufficiently flexible to accommodate shifts in the locations of components in display 14 and substrate 22 (i.e., manufacturing variations that affect the angular orientation of flexible printed circuit cable 26 in the X-Y plane and lateral locations of the ends of flexible printed circuit cable 26 along the X and Y axis), flexible printed circuit cable 26 may be provided with one or more slits. The slits may run along the length of flexible printed circuit cable 26 (i.e., the flexible printed circuit cable may have a longitudinal axis along which the flexible printed circuit cable extends and the slits may run partway along the length of the flexible printed circuit cable parallel to the longitudinal axis).

Figure 3:
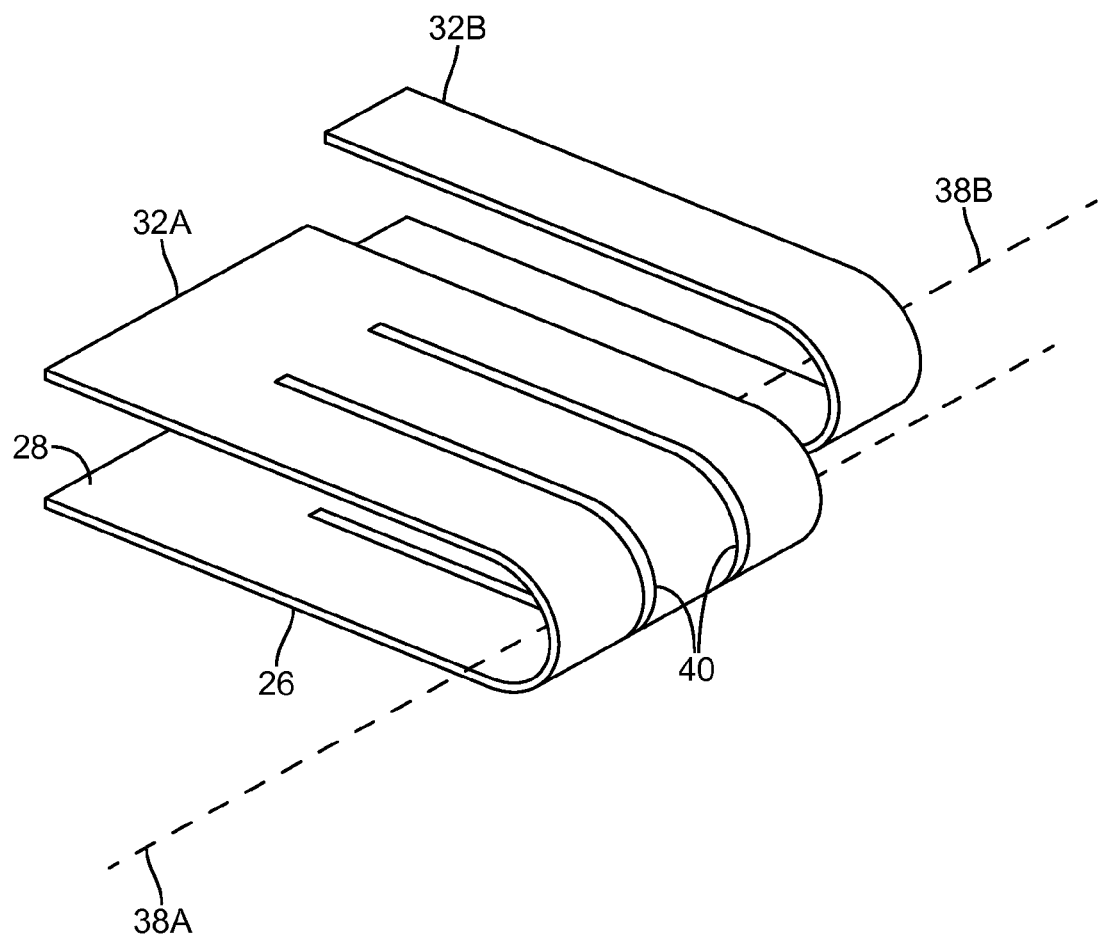
FIG. 3 is a perspective view of an illustrative flexible printed circuit cable having slits and having a split that divides the flexible printed circuit cable into two parallel flexible printed circuit cable branches in accordance with an embodiment.

FIG. 3 is a perspective view of an illustrative flexible printed circuit cable with slits. As shown in FIG. 3, flexible printed circuit cable 26 may have end 28 and a Y-shape that branches into ends 32A and 32B. With this type of arrangement, one branch of flexible printed circuit cable 26 may split off from end 28 and may terminate in end 32B and another branch of flexible printed circuit cable 26 may split off from end 28 to terminate at end 32A. The branch of flexible printed circuit cable 26 that extends between end 28 and end 32A may be bent around bend axis 38A. The branch of flexible printed circuit cable 26 that extends between end 28 and end 32B may be bent around bend axis 38B.

Slits may be formed in either or both branches of flexible printed circuit cable 26 of FIG. 3. As shown in FIG. 3, for example, slits 40 may be formed in the branch of flexible printed circuit cable 26 that extends from end 28 to end 32A. Each of slits 40 has an elongated shape that runs parallel to the longitudinal axis of elongated flexible printed circuit cable 26. The shape of each slit 40 may be, for example, a rectangle with a width that is narrower than its length (e.g., a rectangular opening with a length that is ten times as large as its width or more). Slits 40 may pass completely through the dielectric and conductive layers of flexible printed circuit 26 and may be filled with air. There are two slits 40 in FIG. 3, but, in general, there may be any suitable number of slits in flexible printed circuit 26 (e.g., one or more slits, two or more slits, two to five slits, three or more slits, more than five slits, etc.). Slits 40, which may sometimes be referred to as elongated openings, slots, or gaps, may allow portions of flexible printed circuit cable 26 to move relative to other portions of flexible printed circuit cable 26. This may help prevent flexible printed circuit cable 26 from becoming overly stiff, which could lead to stresses that could cause connectors and other electrical joints to become disconnected.

Interconnection cables such as flexible printed circuit cable 26 may carry analog signals, digital signals, direct-current (DC) power and data signals, alternating current (AC) signals, high speed data signals, low speed data signals, or other signals. To prevent excessive interference, it may be desirable to segregate high-speed lines from low-speed lines and/or to segregate signals that produce potential interference (sometimes referred to as aggressors) from signals that are sensitive to potential interference (sometimes referred to as victims).

Figure 4:
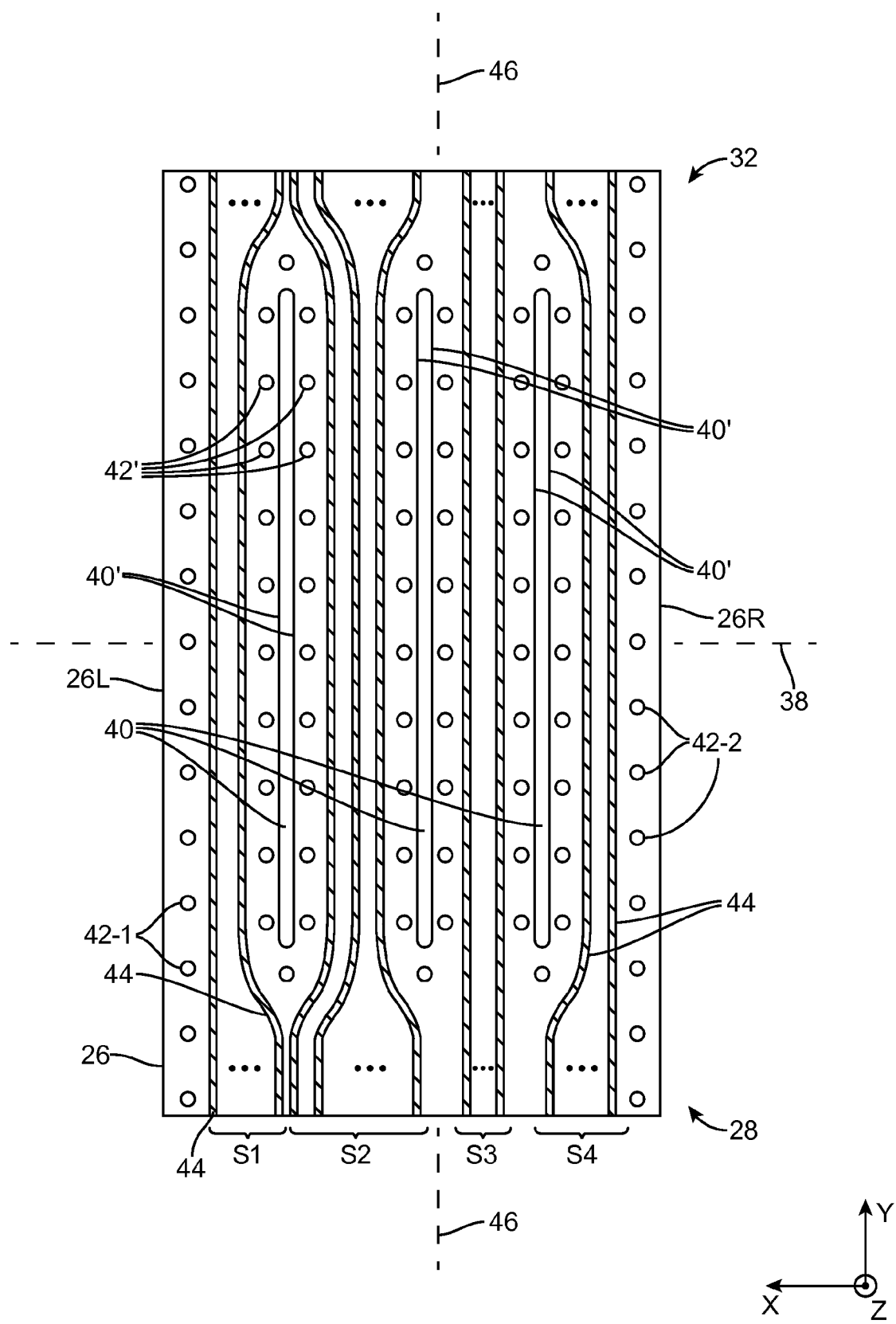
FIG. 4 is a top view of an illustrative flexible printed circuit cable having slits that run parallel to each other along the length of the flexible printed circuit cable and that have signal lines of the type that may be organized to segregate different types of signals from each other in accordance with embodiment.

FIG. 4 is a top view of an illustrative flexible printed circuit cable with slits 40. In the example of FIG. 4, flexible printed circuit 26 extends along longitudinal axis 46 between first end 28 and second end 32. Other layouts may be used for flexible printed circuit cable 26 if desired. The FIG. 4 example is merely illustrative.

As shown in FIG. 4, flexible printed circuit cable 26 may have multiple metal signal traces such as signal traces 44. Signal traces 44 and slits 40 may run parallel to longitudinal axis 46 (i.e., slits 40 may each have a longitudinal axis that runs parallel to longitudinal axis 46). Slits 40 may overlap bend axis 38. Due to the presence of slits 40, flexible printed circuit cable 26 will not be overly stiff and will be able to bend around bend axis 38 when installed within electronic device 10.

Slits 40 may divide metal traces 44 into sets or groups of metal traces such as set S1, set S2, set S3, and set S4. There are four sets of metal traces 44 in the example of FIG. 4, separated by three respective slits 40. Other numbers of slits 40 and sets of metal traces 44 may be used in flexible printed circuit cable 26 if desired. Moreover, there are no branches in flexible printed circuit cable 26 of FIG. 4, because flexible printed circuit cable 26 extends in an undivided fashion between opposing ends 28 and 32. As shown in FIG. 3, flexible printed circuit cable 26 may, if desired, have a division that forms two respective branches, may have multiple splits to form three or more branches, may have branches at either opposing end of flexible printed circuit cable 26, or may have other suitable shapes.

Signals may be assigned to the different sets of metal traces 44 in a way that minimizes interference. For example, with one suitable arrangement, all (or nearly all) signals with more than a particular data rate (i.e., high-speed signals) may be assigned to set S2, whereas all (or nearly all) signals with less than that particular data rate (low-speed signals) may be assigned to sets S1, S3, and S4. With another illustrative configuration, aggressors may be assigned to one set (e.g., set S3), whereas victims may be assigned to other sets (e.g., S1, S2, and S4).

Flexible printed circuit cable 26 may have ground structures that are coupled by vertically extending structures such as vias 42. Vias 42 may extend vertically in dimension Z to couple respective ground layers together or to otherwise short together metal traces in flexible printed circuit cable 26. Signal interference can be minimized by arranging vias 42 in a pattern that forms grounded edges on both sides of each set of signal lines. For example, a series of vias 42-1 may run along left edge 26L of flexible printed circuit cable 26 parallel to dimension Y and a series of vias 42-2 may run along right edge 26R of flexible printed circuit cable 26 parallel to dimension Y. Vias 42' may run parallel to dimension Y along the edges 40' of slits 40. In this way, set S1 of metal traces 44 is electromagnetically isolated from interference by a left-hand ground path formed from vias 42-1 and a right-hand ground path formed from the group of vias 42' along the leftmost edge 40'. Other sets of metal traces 44 are likewise bordered by grounding structures that run along their right and left edges. By bordering the edges of printed circuit cable 26 and the edges of slits 40 with grounding vias, interference between signals on different sets of metal traces 44 and external signal interference may be reduced.

Figure 5:
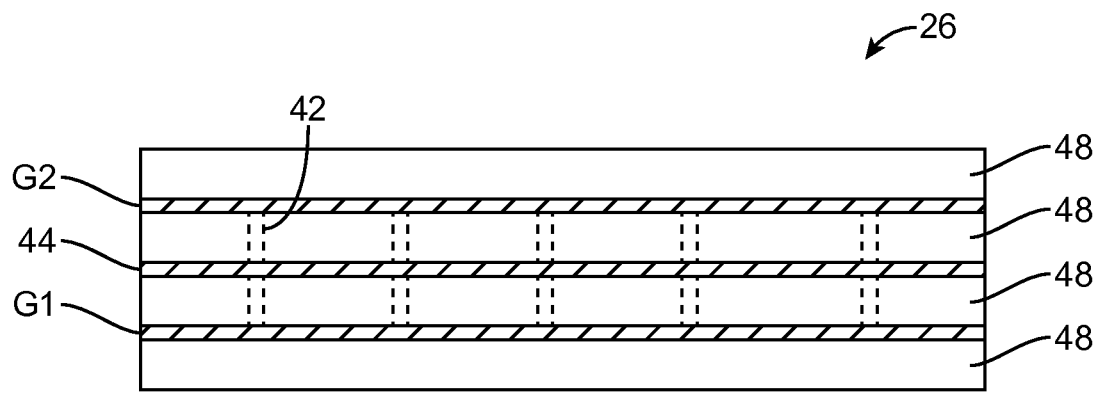
FIG. 5 is a cross-sectional side view of an illustrative flexible printed circuit cable having layers of signal and ground traces embedded within layers of polymer and having vias in accordance with an embodiment.

As shown in the cross-sectional side view of FIG. 5, flexible printed circuit cable 26 may have ground layers such as layers G1 and G2 (e.g., ground layers formed from copper or other metal) and a signal layer of patterned metal traces such as layer 44. Metal traces in layer 44 may lie above lower ground layer G1 and above upper ground layer G2. These conductive structures may be supported by substrate layers such as dielectric layers 48 (e.g., multiple layers of polyimide or other flexible polymer layers that make up the polymer substrate for flexible printed circuit cable 26).

Figure 6:
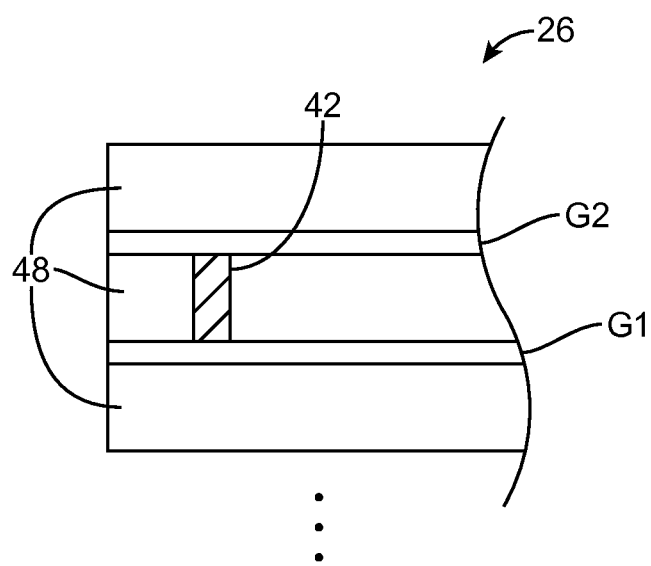
FIG. 6 is a cross-sectional side view of a portion of an illustrative flexible printed circuit showing how ground plane traces in different layers of the flexible printed circuit may be coupled using vias in accordance with an embodiment.

FIG. 6 is a cross-sectional side view of a portion of flexible printed circuit cable 26 of FIG. 5 showing how a via such as via 42 may short lower ground G1 to upper ground G1.

Figure 7:
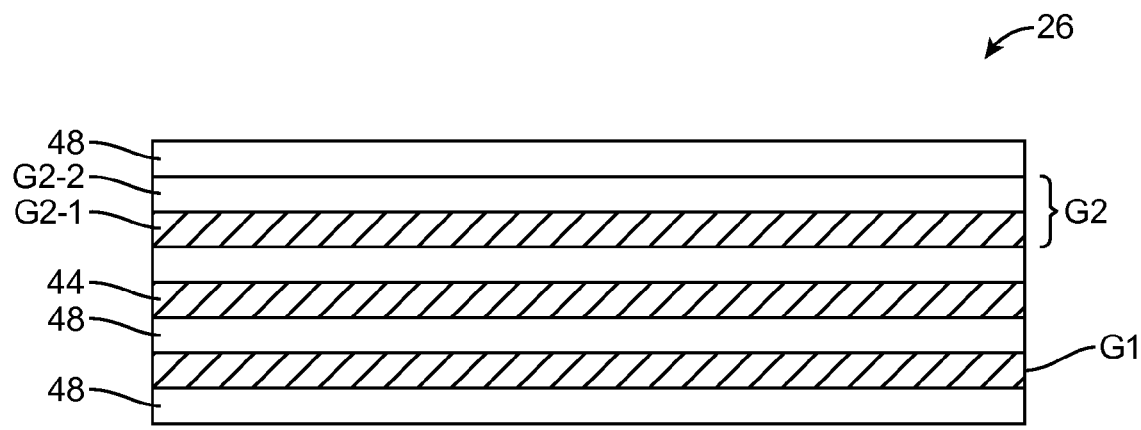
FIG. 7 is a cross-sectional side view of an illustrative flexible printed circuit cable having a ground layer that includes a layer of conductive adhesive in accordance with an embodiment.

In the illustrative configuration of flexible printed circuit cable 26 that is shown in FIG. 7, flexible printed circuit cable 26 has ground layers such as layers G1 and G2 and a signal layer of patterned metal traces such as layer 44 that lies between layers G1 and G2. These conductive layers may be supported by substrate layers such as dielectric layers 48 (e.g., layers of polyimide or other flexible polymer layers in a polymer substrate for cable 26). Ground layer G1 may be formed from a layer of copper (as an example). Ground layer G2 may have a layer of conductive adhesive such as layer G2-1 and may have a conductive layer such as layer G2-2. Layer G2-2 may be a copper foil, silver, or other conductive material.

Figure 8:
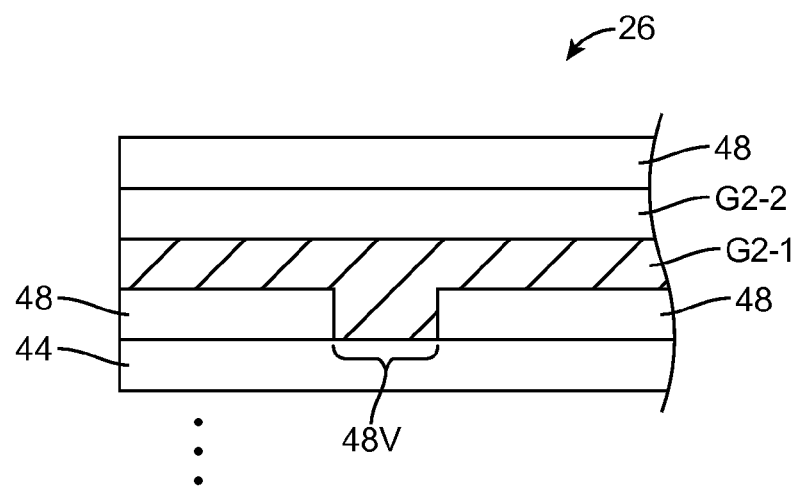
FIG. 8 is a cross-sectional side view of a portion of an illustrative flexible printed circuit of the type shown in FIG. 7 showing how electrical connections may be made between layers in accordance with an embodiment.

FIG. 8 is a cross-sectional side view of a portion of flexible printed circuit cable 26 of FIG. 8 showing how a vertical connection through opening 48V may be formed by a portion of conductive adhesive G2-1. Structures such as the vertical structure of FIG. 8 may be used in forming vias 42 to short together ground layers G1 and G2.

Figure 9:
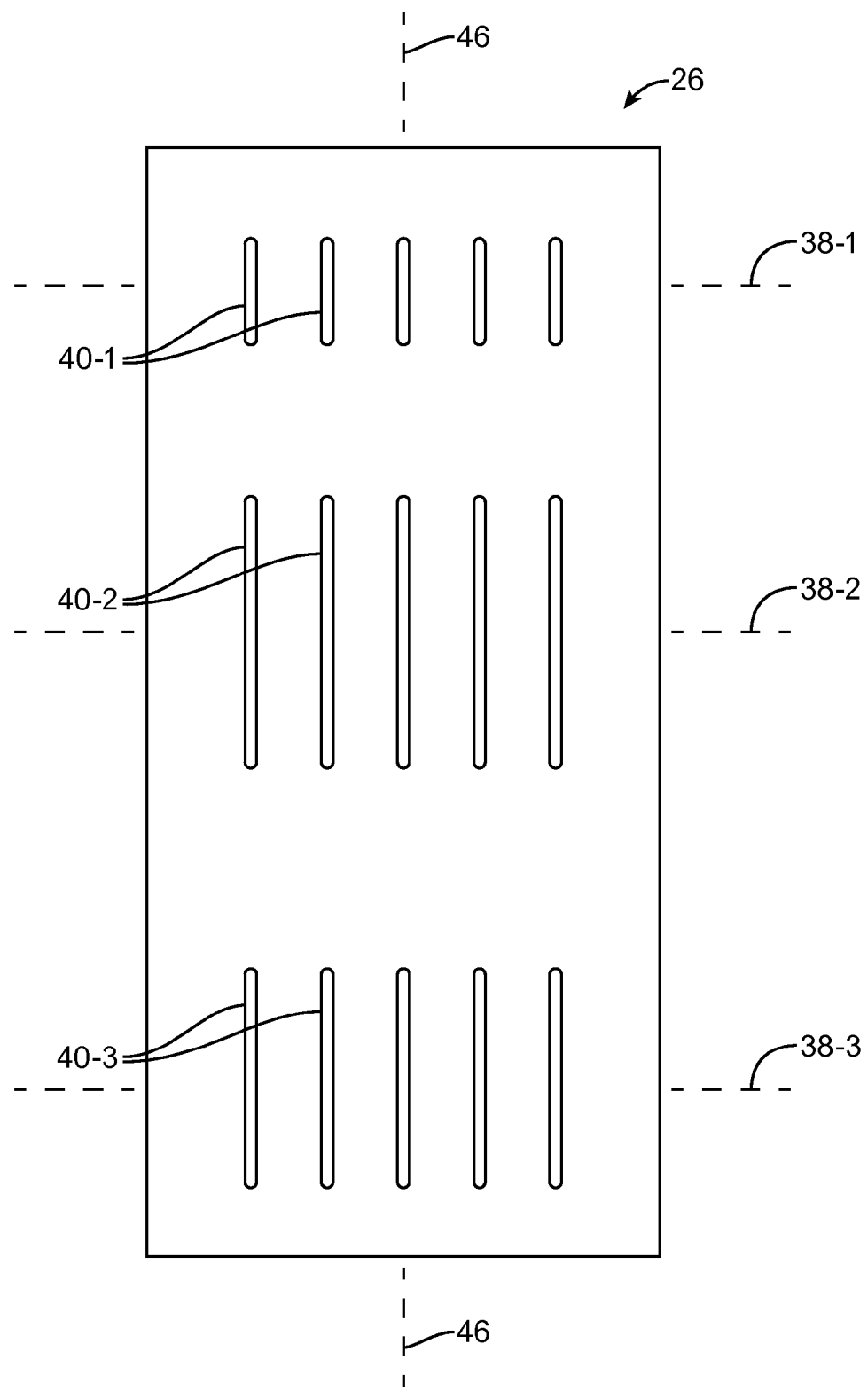
FIG. 9 is a top view of an illustrative flexible printed circuit cable having multiple sets of parallel slits at different respective locations along the length of the flexible printed circuit cable in accordance with an embodiment.

As shown in FIG. 9, flexible printed circuit cable 26 may have multiple sets of slits 40 each of which is located at a different respective position along the length of flexible printed circuit cable 26 and longitudinal axis 46 of flexible printed circuit cable 26. There are three illustrative bend axis locations in FIG. 9. Slits 40-1 overlap bend axis 38-1. Slits 40-2 overlap bend axis 38-2. Slits 40-3 overlap bend axis 38-3.

Figure 10:
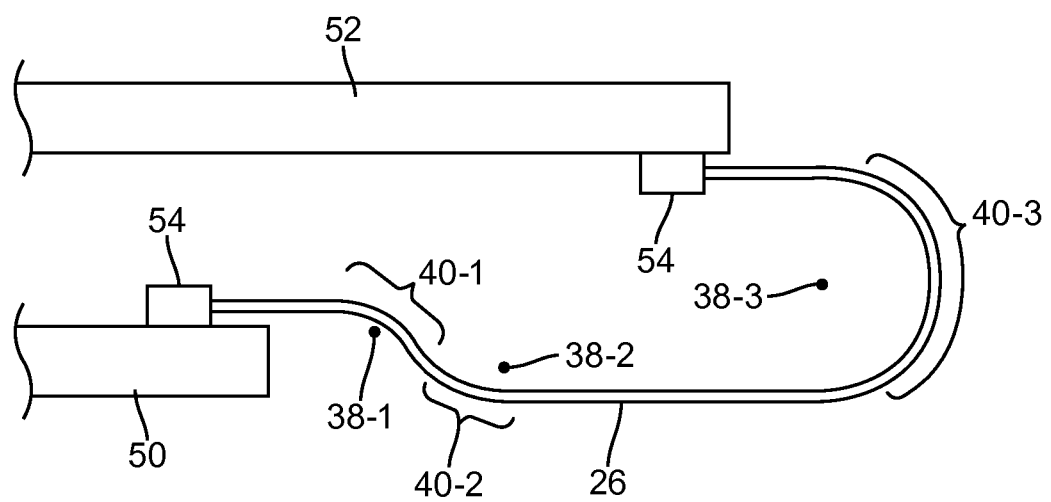
FIG. 10 is a cross-sectional side view of a portion of an electronic device showing how a flexible printed circuit cable may have multiple bends of the type that may overlap slits in accordance with an embodiment.

FIG. 10 is a cross-sectional side view of illustrative flexible printed circuit cable 26 of FIG. 9 showing how cable 26-3 may be bent around each of the bend axes 38-1, 38-2, and 38-3 while coupling structures 50 and 52. Flexible printed circuit cable 26 may have ends that are coupled to structures 50 and 52 using coupling structures 54. Coupling structures 54 may include anisotropic conductive film, welds, solder, connectors, printed circuit boards, or other signal path coupling structures. Structures 50 and 52 may be printed circuits, display 14, a touch sensor, a display pixel array in display 14, buttons, or other circuits.

Figure 11:
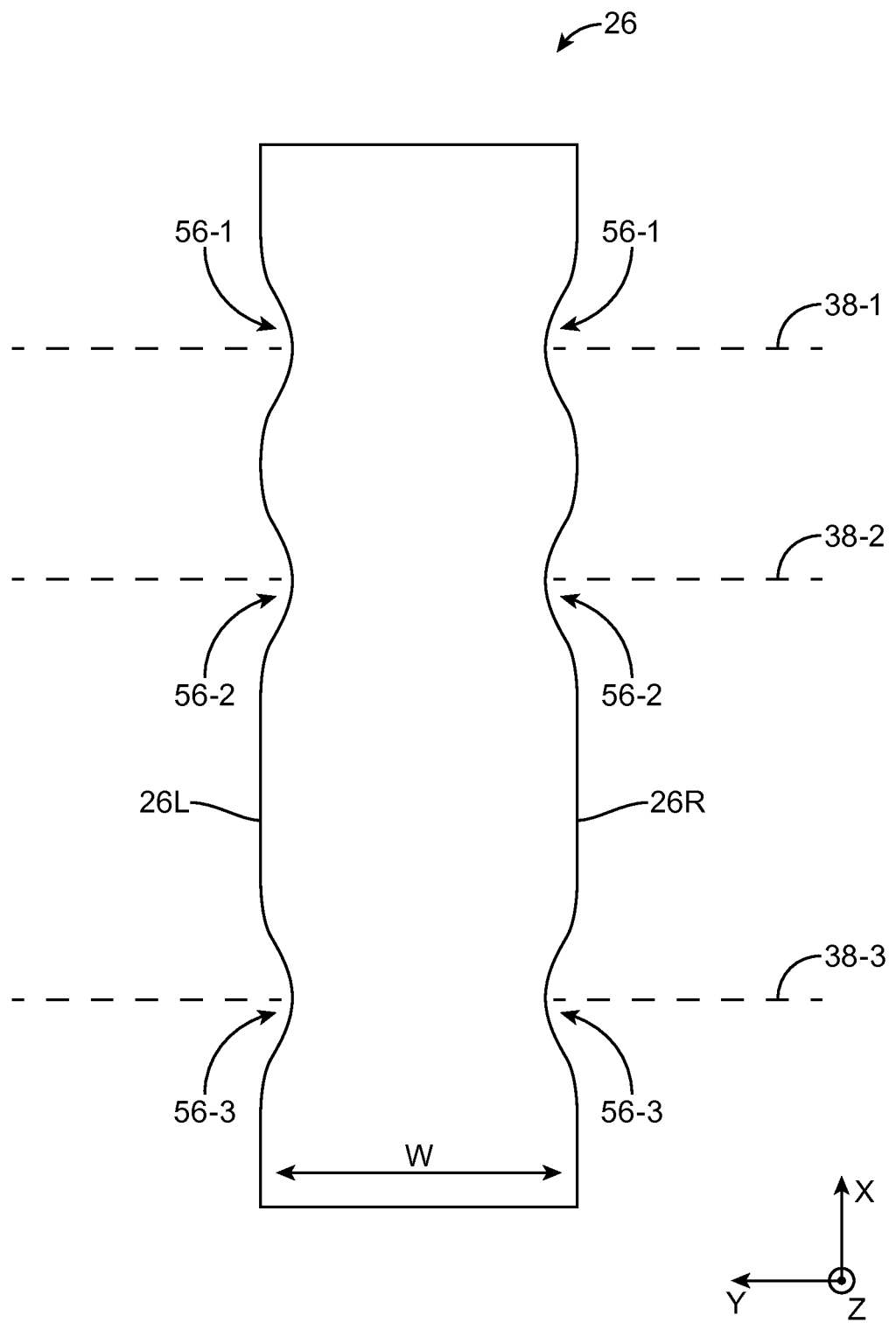
FIG. 11 is a top view of an illustrative flexible printed circuit cable with edge recesses that are configured to locally decrease the width of the flexible printed circuit cable at various locations along the length of the flexible printed circuit cable and thereby enhance flexibility of the flexible printed circuit cable at those locations in accordance with an embodiment.

If desired, flexible printed circuit cable 26 may be provided with a variable width. As shown in FIG. 11, for example, flexible printed circuit cable 26 may be characterized by a width W extending between opposing respective left and right edges 26L and 26R of cable 26. The width W of flexible printed circuit cable 26 may be locally narrowed to enhance flexibility in flexible printed circuit cable 26. As an example, flexible printed circuit cable 26 may be provided with recesses (notches) on one or both edges 26R and 26L of cable 26. These recesses may locally narrow the width of flexible printed circuit cable 26 where cable 26 overlaps bend axes.

In the FIG. 11 example, flexible printed circuit cable 26 has recesses 56-1 that narrow flexible printed circuit cable 26 where flexible printed circuit cable 26 overlaps bend axis 38-1. Flexible printed circuit cable 26 of FIG. 11 also has recesses 56-2 that narrow flexible printed circuit cable 26 where flexible printed circuit cable 26 overlaps bend axis 38-2 and has recesses 56-3 that narrow flexible printed circuit cable 26 where flexible printed circuit cable 26 overlaps bend axis 38-3.

Figure 12:
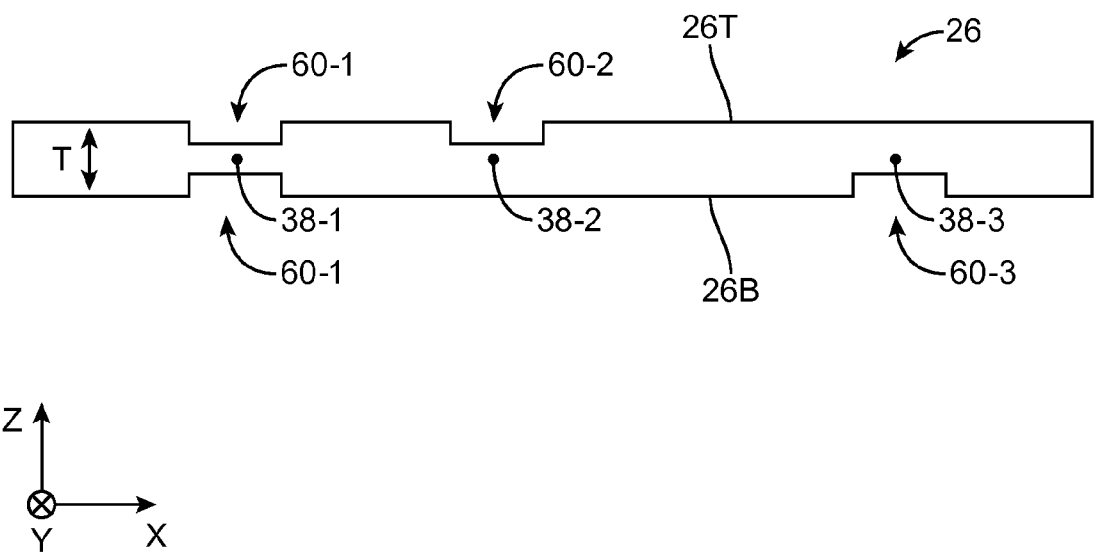
FIG. 12 is a cross-sectional side view of an illustrative flexible printed circuit cable with recesses that are configured to locally decrease the thickness of the flexible printed circuit cable at various locations along the length of the flexible printed circuit cable and thereby enhance flexibility of the flexible printed circuit cable at those locations in accordance with an embodiment.

As shown in FIG. 12, flexible printed circuit cable 26 may be provided with a variable thickness. As shown in FIG. 12, flexible printed circuit cable 26 may be characterized by a thickness T extending between upper surface 26T and opposing lower surface 26B of cable 26. The thickness T of flexible printed circuit cable 26 may be locally thinned to enhance flexibility in flexible printed circuit cable 26. As an example, flexible printed circuit cable 26 may be provided with recesses on one or both surfaces of cable 26 such as upper surface 26T and lower surface 26B. Flexible printed circuit cable 26 may, for example, be provided with recesses such as recesses 60-1 on upper surface 26T and lower surface 26B to locally reduce the thickness of flexible printed circuit cable 26 in a location that overlaps bend axis 38-1, recess 60-2 on upper surface 26T to locally reduce the thickness of flexible printed circuit cable 26 in a location that overlaps bend axis 38-2, and recess 60-3 on lower surface 26B to locally reduce the thickness of flexible printed circuit cable 26 in a location that overlaps bend axis 38-3. Recesses to thin the thickness of flexible printed circuit cable 26 may extend into one or more of the polymer layers that form the substrate of flexible printed circuit cable 26.

In general, flexible printed circuit cable 26 may have one or more sets of slits 40 in combination with optional features such as optional horizontal width narrowing recesses and/or optional thickness narrowing recesses to form bendable regions overlapping one or more, two or more, three or more, or four or more bend axes.

Figure 13:
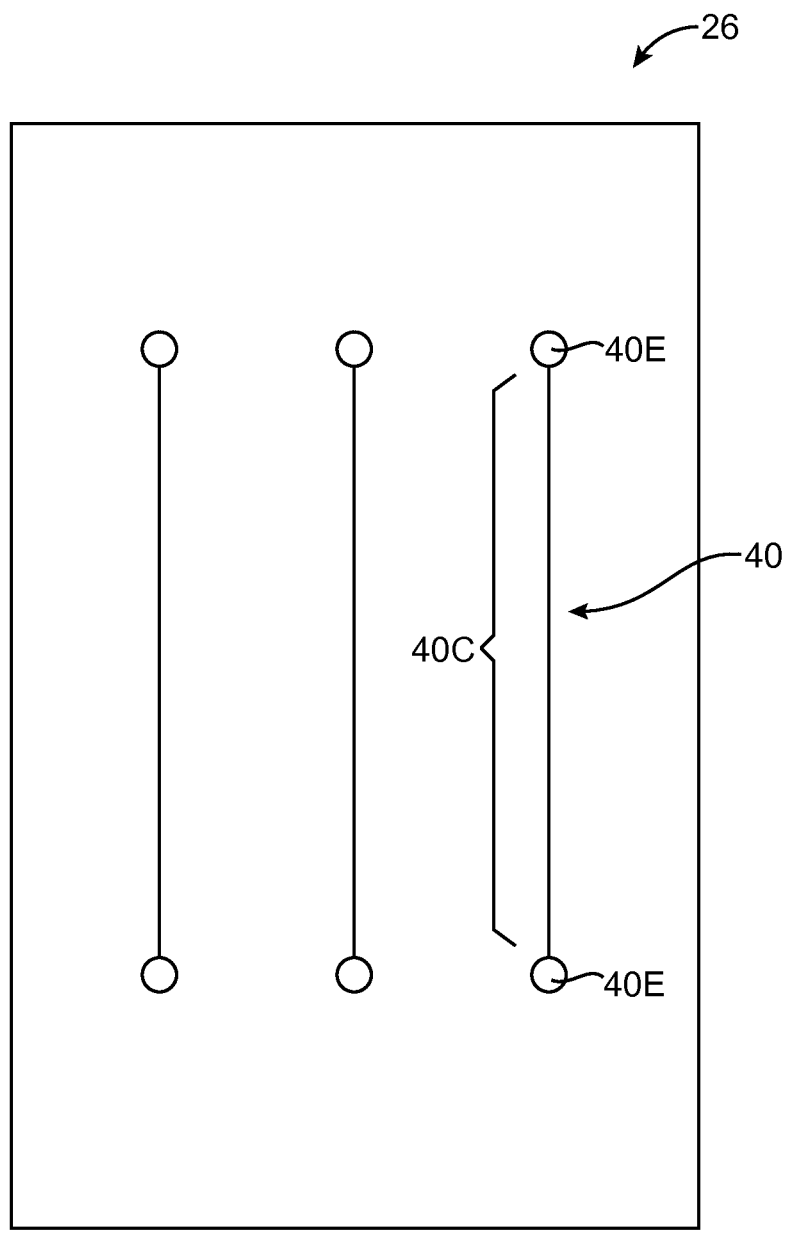
FIG. 13 is a top view of an illustrative flexible printed circuit cable having slits with stress relief features in accordance with an embodiment.

Slits 40 may be formed by removing material from flexible printed circuit cable 26 (e.g., using die cutting, using a movable cutting head such as a drill, using a laser-cutting scheme, or using other material removal techniques). Slits 40 may also be formed by cutting flexible printed circuit cable 26 using a knife or other tool that does not remove material (i.e., using a knife to form a slit by forming a cut line in cable 26 without removing material along the cut line). Slits 40 formed by removing a portion of flexible printed circuit cable 26 and/or slits 40 that are formed by cutting lines into flexible printed circuit 26 using a knife may be susceptible to tearing at their ends. Stress relief features such as circular openings or openings of other shapes may be formed in flexible printed circuit 26 to help prevent tearing. As shown in the top view of FIG. 13, for example, slits 40 may have main portions 40C (i.e., openings in flexible printed circuit that are formed from cut lines with no removed material and/or slits that are formed from elongated openings created by removing material). Main portions 40C may have the shape of straight lines. At opposing ends of each main portion 40C, slits 40 may be provided with stress relief openings 40E. Stress relief openings 40E may, for example, be formed by drilling holes in flexible printed circuit 26 at opposing ends of each slit 40.

The foregoing is merely illustrative and various modifications can be made by those skilled in the art without departing from the scope and spirit of the described embodiments. The foregoing embodiments may be implemented individually or in any combination.

What is claimed is:

1. A flexible printed circuit cable, comprising:
a flexible polymer substrate with a bend around a bend axis;
metal signal line traces supported by the flexible polymer substrate; and
at least one slit that passes through the flexible polymer substrate, wherein the at least one slit overlaps the bend axis, wherein the flexible printed circuit cable has a Y-shape with first and second branches, wherein the first branch bends around the bend axis and is coupled to a first component, and wherein the second branch bends around an additional bend axis that is different than the bend axis and is coupled to a second component that is different than the first component.

2. The flexible printed circuit cable defined in claim 1 wherein the flexible polymer substrate comprises at least one layer of polyimide and wherein the at least one slit divides the metal signal line traces into multiple sets of signal line traces.

3. The flexible printed circuit cable defined in claim 1 further comprising upper and lower ground layers supported by the flexible polymer substrate, wherein the metal signal line traces lie between the upper and lower ground layers.

4. The flexible printed circuit cable defined in claim 3 wherein the at least one slit passes through the upper and lower ground layers.

5. The flexible printed circuit cable defined in claim 4 wherein the flexible polymer substrate is an elongated flexible polymer substrate that extends along a longitudinal axis and wherein the at least one slit comprises a plurality of slits that extend parallel to the longitudinal axis.

6. The flexible printed circuit cable defined in claim 5 further comprising a plurality of conductive vias that are coupled between the upper and lower ground layers.

7. The flexible printed circuit cable defined in claim 6 wherein the slits have edges and wherein the vias include vias that run along the edges of the slits.

8. The flexible printed circuit cable defined in claim 7 wherein the flexible polymer substrate comprises at least one polymer layer having a width extending between opposing edges and wherein the flexible polymer substrate comprises at least one recess that locally narrows the width.

9. The flexible printed circuit cable defined in claim 4 wherein the flexible polymer substrate has a width extending between opposing edges and wherein the flexible polymer substrate comprises at least one recess that locally narrows the width.

10. The flexible printed circuit cable defined in claim 9 wherein the flexible polymer substrate comprises multiple layers of polymer.

11. A flexible printed circuit cable, comprising:
at least one layer of polymer with a bend around a bend axis;
at least one metal signal trace on the layer of polymer;
a slit that passes through the layer of polymer, wherein the slit has edges, wherein the slit overlaps the bend axis; and
vias that run along the edges of the slit, wherein each via passes through the layer of polymer, wherein the flexible printed circuit cable has a first branch that bends around the bend axis and is coupled to a display, and wherein the flexible printed circuit cable has a second branch that bends around an additional bend axis that is different than the bend axis and is coupled to a touch sensor.

12. The flexible printed circuit cable defined in claim 11 further comprising upper and lower ground layers, wherein the vias extend between the upper and lower ground layers and wherein the at least one metal signal trace comprises multiple metal signal traces running in parallel with each other.

13. The flexible printed circuit cable defined in claim 11 further comprising stress relief openings at opposing ends of the slit.

14. The flexible printed circuit cable defined in claim 1, wherein the flexible polymer substrate has a thickness extending between opposing upper and lower surfaces and wherein the flexible polymer substrate comprises at least one recess that locally thins the thickness.

15. The flexible printed circuit cable defined in claim 1, wherein the flexible polymer substrate is an elongated flexible polymer substrate that extends along a longitudinal axis, and wherein the longitudinal axis is perpendicular to the bend axis.

16. The flexible printed circuit cable defined in claim 11, wherein the at least one layer of polymer has a width extending between opposing edges and wherein the at least one layer of polymer comprises a plurality of recesses that locally narrow the width.

17. The flexible printed circuit cable defined in claim 16, wherein the bend around the bend axis is one of a plurality of bends around respective bend axes, and wherein each recess overlaps a respective bend axis.

18. The flexible printed circuit cable defined in claim 1, wherein the additional bend axis is parallel to the bend axis, wherein the first branch comprises a first portion of the flexible printed circuit cable that is bent to overlap a second portion of the flexible printed circuit cable, and wherein the second branch comprises a third portion of the flexible printed circuit cable that is bent to overlap a fourth portion of the flexible printed circuit cable.

19. The flexible printed circuit cable defined in claim 18, wherein the first component comprises a display, wherein the second component comprises a touch sensor, wherein the first branch is coupled to the display with a first connector, and wherein the second branch is coupled to the touch sensor with a second connector.

20. The flexible printed circuit defined in claim 11, wherein the additional bend axis is parallel to the bend axis, wherein the first branch is coupled to the display with a first connector, wherein the second branch is coupled to the touch sensor with a second connector, and wherein the first and second branches are both coupled to a printed circuit board with a third connector.

* * * * *